United States Patent [19]
Nakagawa

[11] Patent Number: 5,874,350
[45] Date of Patent: Feb. 23, 1999

[54] PROCESS FOR PREPARING A FUNCTIONAL THIN FILM BY WAY OF THE CHEMICAL REACTION AMONG ACTIVE SPECIES

[75] Inventor: Katsumi Nakagawa, Nagahama, Japan

[73] Assignee: Canon Kabushiki Kaisha, Tokyo, Japan

[21] Appl. No.: 322,410

[22] Filed: Oct. 13, 1994

Related U.S. Application Data

[60] Continuation of Ser. No. 121,196, Sep. 15, 1993, abandoned, which is a division of Ser. No. 46,906, Apr. 15, 1993, Pat. No. 5,269,848, which is a continuation of Ser. No. 771,535, Oct. 7, 1991, abandoned, which is a continuation of Ser. No. 541,472, Jun. 25, 1990, abandoned, which is a continuation of Ser. No. 168,476, Mar. 15, 1988, abandoned.

[30] Foreign Application Priority Data

Mar. 20, 1987 [JP] Japan ................................. 62-66518
Mar. 9, 1988 [JP] Japan ................................. 63-53708

[51] Int. Cl.$^6$ ................................................. H01L 21/205
[52] U.S. Cl. ........................ 438/485; 438/584; 438/758; 427/562; 427/563; 427/578
[58] Field of Search ...................................... 437/113, 101; 427/561, 562, 563, 568, 578, 485, 482, 584, 758; 148/161

[56] References Cited

U.S. PATENT DOCUMENTS

| | | |
|---|---|---|
| 3,517,643 | 6/1970 | Goldstein et al. . |
| 3,916,034 | 10/1975 | Tsuchimoto . |
| 4,051,382 | 9/1977 | Ogawa et al. . |
| 4,262,631 | 4/1981 | Kubacki .................................. 118/723 |
| 4,522,674 | 6/1985 | Ninomiya et al. . |
| 4,554,180 | 11/1985 | Hirooka . |
| 4,687,544 | 8/1987 | Bersin . |
| 4,689,093 | 8/1987 | Ishihara . |
| 4,717,585 | 1/1988 | Ishihara et al. ........................... 427/568 |
| 4,728,528 | 3/1988 | Ishihara et al. ........................... 427/578 |
| 4,803,093 | 2/1989 | Ishihara et al. ........................... 427/568 |
| 4,835,005 | 5/1989 | Hirooka et al. . |
| 4,849,249 | 7/1989 | Ishihara et al. ............................. 427/38 |
| 4,916,091 | 4/1990 | Freeman et al. ........................... 427/578 |
| 5,002,793 | 3/1991 | Arai . |
| 5,244,698 | 9/1993 | Ishihara et al. ........................... 427/578 |

FOREIGN PATENT DOCUMENTS

| | | |
|---|---|---|
| 58-202533 | 11/1983 | Japan . |
| 60-50169 | 3/1985 | Japan . |
| 61-179870 | 8/1986 | Japan ..................................... 427/578 |
| 61-189627 | 8/1986 | Japan ..................................... 427/578 |

*Primary Examiner*—John F. Niebling
*Assistant Examiner*—Matthew Whipple
*Attorney, Agent, or Firm*—Fitzpatrick, Cella, Harper & Scinto

[57] ABSTRACT

A method for forming a functional silicon- or germanium-containing amorphous deposited film on a substrate which comprises a film-forming chamber having a film-forming space, a substrate holder and an electric heater for positioning the substrate in the film-forming chamber, an exhaust pipe in fluid communication with the film-forming chamber, a first gas-introducing portion for providing an active species (H), having an activation space for generating the active species (H), a microwave discharge supply source and a passage for providing a gaseous hydrogen-containing material into the activation space in order to produce the active species (H), a second gas-introducing portion for providing a gaseous silicon- or germanium-containing material (X), capable of reacting with the active species (H) to form a reaction product (HX) that is capable of forming the functional deposited film on the substrate, and a transportation path having a mixing space and a second microwave discharge energy supply source for promoting reaction with the active species.

3 Claims, 6 Drawing Sheets

PROCESS FOR PREPARING A FUNCTIONAL THIN FILM BY WAY OF THE CHEMICAL REACTION AMONG ACTIVE SPECIES

This application is a continuation of application Ser. No. 08/121,196 filed Sep. 15, 1993, now abandoned, which is a division of application Ser. No. 08/046,906 filed Apr. 15, 1993, now U.S. Pat. No. 5,269,848, issued Dec. 14, 1993, which is a continuation of application Ser. No. 07/771,535 filed Oct. 7, 1991, now abandoned, which is a continuation of application Ser. No. 07/541,472 filed Jun. 25, 1990, now abandoned, which is a continuation of application Ser. No. 07/168,476 filed Mar. 15, 1988, now abandoned.

FIELD OF THE INVENTION

This invention relates to a process for preparing a functional deposited thin film usable as an element member in various semiconductor devices and an apparatus suited for practicing said process.

BACKGROUND OF THE INVENTION

There have been proposed a number of amorphous silicon (hereinafter referred to as "A-Si") films for use as an element member in semiconductor devices, image input line sensors, image pickup devices or the like. Some such films have been put to practical use.

Along with those amorphous silicon films, there have been proposed various methods for their preparation using vacuum evaporation technique, heat chemical vapor deposition technique, plasma chemical vapor deposition technique, reactive sputtering technique, ion plating technique and light chemical vapor deposition technique.

Among those methods, the method using heat chemicals vapor deposition technique (hereinafter referred to as "CVD method") had been tried once in various sectors, but nowadays it is not used because elevated temperatures are required and a practical deposited film can not be obtained as desired.

On the other hand, the method using plasma chemical vapor deposition technique (hereinafter referred to as "plasma CVD method") has been generally recognized as being the most preferred and is currently used to manufacture amorphous silicon films on a commercial basis.

However, for any of the known A-Si films, even if it is such that it is obtained by plasma CVD method, there still remain problems unsolved relating to the film's characteristics, particularly electric and optical characteristics, deterioration resistance upon repeated use and use-environmental characteristics. The solutions to these problems must correlate with its use as an element member for the foregoing devices and also for other points such as its homogeneity, reproducibility and mass-productivity.

Now, although the plasma CVD method is widely used nowadays as above mentioned, it is still accompanied by problems since it is practiced under elevated temperature conditions. Other problems are presented in the process, including the apparatus to be used.

Regarding the former problems, because the plasma CVD method is practiced while maintaining a substrate at elevated temperature, the kind of the substrate to be used is limited to those which do not contain a material such as a heavy metal, which can migrate and sometimes cause changes in the characteristics of the deposited film to be formed. Secondly, the substrate thickness is likely to be varied on standing in the plasma CVD method. Therefore, the resulting deposited film, lacking in uniformity of thickness and in homogeneity of composition, can exhibit changed characteristics.

Regarding the latter problems, the operation conditions to be employed under the plasma CVD method are much more complicated than the known CVD method, and it is extremely difficult to generalize them.

That is, there already exist a number of variations even in the correlated parameters concerning the temperature of a substrate, the amount and the flow rate of gases to be introduced, the degree of pressure and the high frequency power for forming a layer, the structure of an electrode, the structure of a reaction chamber, the rate of flow of exhaust gases, and the plasma generation system. Besides said parameters, there also exist other kinds of parameters. Under these circumstances, in order to obtain a desirable deposited film product, it is required to choose precise parameters from a great number of varied parameters. Sometimes, serious problems occur. Because of the precisely chosen parameters, a plasma is apt to be in an unstable state. This condition often invites problems in a deposited film to be formed.

And for the apparatus in which the process using the plasma CVD method is practiced, its structure will eventually become complicated since the parameters to be employed are precisely chosen as above stated. Whenever the scale or the kind of the apparatus to be used is modified or changed, the apparatus must be so structured as to cope with the precisely chosen parameters.

In this regard, even if a desirable deposited film should be fortuitously mass-produced, the film product becomes unavoidably costly because (1) a heavy initial investment is necessitated to set up a particularly appropriate apparatus therefor; (2) a number of process operation parameters even for such apparatus still exist and the relevant parameters must be precisely chosen from the existing various parameters for the mass-production of such film. In accordance with such precisely chosen parameters, the process must then be carefully practiced.

In order to prepare a desired functional A-Si film without the above problems, there has been proposed a method by way of the chemical reaction among gaseous raw material and active species or by way of the chemical reaction active species using a fabrication apparatus as shown in FIG. 1 or another fabrication apparatus as shown in FIG. 2.

The fabrication apparatus of FIG. 1 comprises a film forming chamber 102, a film forming raw material gas transportation pipe 105, an active species (I) generation region 108 and a pipe portion 109 having a space B for mixing a film forming raw material gas and an active species (I) and transporting a gaseous mixture of them into the film forming chamber.

The film forming chamber 102 has a film forming space A in which a substrate holder 103 for substrate 104 having electric heater 110 being connected to a power source (not shown) by means of lead wires (not shown) is installed.

The film forming chamber 102 is provided with an exhaust pipe 101' connected through a main valve (not shown) to an exhaust pump 101, and the exhaust pipe is provided with a subsidiary valve (not shown) serving to break the vacuum in the film forming chamber 102. Numeral 111 stands for a vacuum gauge to monitor the inner pressure of the film forming space A.

The active species (I) generation region 108 comprises pipe portion 106 having an active species (I) generation space C with which a microwave energy applying applicator 107 is provided, and the microwave introducing applicator is connected to a microwave power source. To one end of the pipe portion 106, an active species (I) raw material gas ($H_2$) feed pipe extended from a reservoir for said gas is connected. The other end of the pipe portion 106 is joined with the film forming raw material gas transportation pipe 105 at the upstream region of the pipe portion 106.

The pipe portion 106 is open at its downstream end in the film forming space A. To the end portion of the film forming raw material gas transportation pipe 105, a film forming raw material gas ($SiF_4$) feed pipe extended from a reservoir for said gas is connected.

The fabrication apparatus of FIG. 2 is a partial modification of the fabrication apparatus of FIG. 1, and the modified part is that the film forming raw material gas transportation pipe 105 in FIG. 1 is replaced by an active species (II) generation region 201. In the fabrication apparatus of FIG. 2, the active species (II) generation region 201 comprises pipe portion 105 having an active species (II) generation space D with which a microwave energy applying applicator 202 is provided, and the microwave introducing applicator 202 is connected to a microwave power source (not shown).

The film forming process for preparing a A-Si thin film using the fabrication apparatus of FIG. 1 is carried out, for example, in the following way.

That is, the air in the film forming chamber, the film forming raw material gas transportation pipe 105 and t he precursor generation space C is evacuated by opening the main valve of the exhaust pipe 101' to bring the chamber and other spaces to a desired vacuum. Then the heater 110 is activated to uniformly heat the substrate 104 to a desired temperature, and it is kept at this temperature. At the same time, $SiF_4$ gas is fed at a desired flow rate into the transportation pipe 105 and then into the film forming space A through the space B. Concurrently, $H_2$ gas is fed at a desired flow rate into the active species (I) generation space C and then into the film forming space A through the space B. After the flow rates of the two gases became stable, the vacuum of the film forming space A is brought to and kept at a desired value by regulating the main valve of the exhaust pipe 101'.

After the vacuum of the film forming space A becomes stable, the microwave power source is switched on to apply a discharge energy of a desired power into the active species (I) generation space C through the microwave energy applying applicator 107.

In this event, $H_2$ gas is activated with the discharge energy to generate active species (I), which are successively flowed into the space B, then mixed with $SiF_4$ gas flowed from the transportation pipe 105 therein, and transported into the film forming space A while being chemically reacted. The gaseous reaction mixture thus introduced is flowed in the space surrounding the surface of the substrate 104 being maintained at a desired temperature in the film forming space A and decomposed to thereby cause the formation of a A-Si:H:F thin film on the substrate.

The chemical reactions to cause the formation of said A-Si:H:F thin film in the case of the above process using the fabrication apparatus of FIG. 1 is considered to be progressed in the following ways.

(a) Reaction in the active species (I) generation space C:
$H_2 \rightarrow 2 \cdot H$($\cdot H$ means hydrogen radical)

(b) Reaction in the space B:
(i) $\cdot H + SiF_4 \rightarrow$ reaction product (1)
(ii) $\cdot H +$ the reaction product I$\rightarrow$reaction product (2)

The above-mentioned reaction product (1) is a molecule or a radical which are not sufficiently reduced and which are highly volatile, and it does not directly contribute to the formation of said A-Si:H:F thin film as it is. The above-mentioned reaction product (2) is a product resulting from the reaction product (1) being further reduced with the hydrogen radical ($\cdot H$), and it contributes to the formation of said A-Si:H:F thin film on the substrate 104 in the film forming space A.

The exact mechanism of how the formation of said A-SiH:F thin film is caused onto the surface of the substrate is not clarified yet. However it is thought that the reaction product (2) as it flows into the film forming space A will be decomposed by the action of a thermal energy in the space surrounding the surface of the substrate being maintained with an elevated temperature and some of the reaction product (2) will collide against said surface of the substrate to thereby decompose into neutral radical particles, ion particles, electrons, etc. The chemical reactions among them will result in formation of said A-Si:H:F thin film on the surface of the substrate.

However, there still remain unsolved problems in the case of the above process using the fabrication apparatus of FIG. 1 That is, as mentioned in the above reactions (b), hydrogen radical ($\cdot H$) as generated in the active species (I) generation space C will be consumed twice for the reaction (i) and for the reaction (ii) and because of this, the amount of the reaction product (2) to be produced in the space B depends upon the amount of the remaining hydrogen radical. However, in the case of the known process using the fabrication apparatus of FIG. 1, the amount of such hydrogen radical to be directed to forming the reaction product (2) is not sufficient so that the reaction product (2) cannot be sufficiently produced and because of this, it is almost impossible to stably and efficiently form a desired deposited film at a high deposition rate and with a high utilization efficiency of raw material gas.

In addition to this problem, there are also other problems for the process using the fabrication apparatus of FIG. 1. That is, $H_2$ gas is not efficiently consumed to generate hydrogen radical in the active species (I) generation space C and as a result , the amount of the hydrogen radical to be generated therein eventually becomes insufficient. And the hydrogen radical as generated will often collide against the inner wall face having roughness and occasionally having foreign deposits thereon, and if such situation happens, the radical becomes deactivated to be neutral as it is transported to space B. Therefore, there often occurs changes in the amount of the hydrogen radical to arrive in the space B, which result in bringing about changes in the amounts of the reaction product (1) and because of this, the deposition rate of a deposited film to be formed will be changed and it will become difficult to stably obtain a desired deposited film of an uniform film quality.

As for the film forming process for forming a A-Si:H:F thin film using the fabrication apparatus of FIG. 2, it is carried out in the same way as in the case of the above process using the fabrication apparatus except that a microwave discharge energy of a desired power is applied into the active species (II) generation space D to thereby generate active species (II) from $SiF_4$.

The chemical reactions to cause the formation of said A-Si:H:F film i n the case of the process using the fabrication apparatus of FIG. 2 is considered to be progressed in the following ways.

(a) Reaction in the active species (I) generation space C:
$H_2 \rightarrow 2 \cdot H$ ($\cdot H$ means hydrogen radical)

(b) Reaction in the active species (II) generation space D:
$SiF_4 \rightarrow$ decmposed product such as $SiF_2^*$, $SiF_3^*$, $Si^*$, $SiF_2$, etc.

(c) Reaction in the space B:
$\cdot H +$ decomposed product$\rightarrow$reaction product (3)

And the exact mechanism of how the formation of said ASi:H:F thin film is caused onto the surface of the substrate is not clarified yet.

However, it is thought that the reaction product (3) as it flows into the film forming space A will be decomposed by the action of a heat energy in the space surrounding the surface of the substrate being maintained with an elevated temperature and some of the reaction product (3) will collide against said surface of the substrate to thereby decompose into neutral radical particles, ion particles, electrons, etc. The chemical reactions among them will result in the formation of said A-Si:H:F thin film on the surface of the substrate.

However, even for this process, there still remains unsolved problems. That is, undesired changes often occur on the deposition rate and because of this, it is difficult to stably and efficiently obtain a desired A-Si:H:F thin film of an uniform film quality with a high deposition rate and with a high raw material gas utilization efficiency. In addition to this problem, there are also other problems. That is, as well as in the case of process using the fabrication apparatus of FIG. 1, $H_2$ gas is not efficiently consumed to generate hydrogen radical (·H) in the active species (I) generation space C and the amount of the hydrogen radical to be generated therein eventually becomes insufficient. And the hydrogen radical as generated will often collide against the inner wall face having roughness and occasionally having foreign deposits thereon and hence, while the radical is being transported to the space B it becomes deactivated to be neutral. And there often occurs changes in the amount of the hydrogen radical to arrive in the space B, which results in bringing about changes in the amounts of the reaction products (3). Further, certain amount of the decomposed product will be left without being consumed in the above-mentioned reaction (c) and it is flowed into the film forming space A. Because of this, the decomposed product that flowed into the film forming space A will have undesired influence on the resulting deposited film.

In view of the above, there is now an increased demand for providing an imposed process that makes it possible to stably and efficiently mass-produce a desirable A-Si thin film of good film quality which has a wealth of practically applicable characteristics with a high deposition rate and with a high raw material gas utilization efficiency. Besides silicon, there is a similar situation for other kinds of non-single crystal functional materials such as polycrystal silicon, silicon nitride, silicon-germanium, silicon carbide, and silicon oxide films.

SUMMARY OF THE INVENTION

The present inventions have conducted extensive studies in order to solve the problems in the aforementioned known process and in order to develop an improved process for effectively and simply preparing a functional deposited film such as a A-Si thin film which has a wealth of many practically applicable characteristics and which is usable as an element member in various semiconductor devices.

As a result, the present inventors have finally found a process that enables stable and efficient formation of a desirable functional deposited film usable as an element member in various semiconductor devices by the simple procedures detailed below.

It is therefore an object of this invention to provide an improved process for preparing a high quality functional deposited film free from contamination of foreign matters and having a wealth of many practically applicable characteristics and which is suited for use in various semiconductors at a high deposition rate and with a high raw material gas utilization efficiency.

Another object of this invention is to provide an improved process for preparing the foregoing functional deposited film by introducing a material capable of supplying atoms to be constituents for said film and a gaseous active species reactive with said material into a separate space isolated from a film forming space, starting chemical reaction among them and concurrently applying a reaction promotion energy into said separate space to thereby form a gaseous product capable of contributing to the formation of said film, and introducing the resulting gaseous product into said film forming space having a substrate being maintained at an elevated temperature to thereby form said film on the surface of said substrate at a high deposition rate without the use of plasma discharge in said film forming space.

A further object of this invention is to provide an apparatus suitable for practicing said process.

According to one aspect of this invention, there is provided an improved process for preparing a desirable functional deposited film, characterized in that the chemical reaction among a material (X) capable of supplying atoms to be constituents for said film and a gaseous active species (H) generated from a gaseous chemical substance (Y) which is reactive with said material (X) is carried out while applying a reaction promotion energy to produce a gaseous product (HX) capable of contributing to the formation of said film in a space isolated from a film forming space and said gaseous product (HX) is introduced into said film forming space being maintained with a desired vacuum and having a substrate being kept with an elevated temperature to thereby form said film on the surface of the substrate at a high deposition rate and with a high raw material gas efficiency without the use of plasma discharge.

According to a further aspect of this invention, an apparatus is provided which is suitable for practicing the above process, characterized by comprising an activation space (1), a first introducing means for the foregoing gaseous substance (Y), a second introducing means for the foregoing material (X), a means to apply an activation energy onto the foregoing gaseous chemical substance (Y) as introduced in said activation space (1) to generate the foregoing active species (H), a transportation means having a mixing space (2) to which said first introducing means and said second introducing means being connected, a means to apply a reaction promotion energy onto a mixture of the foregoing material (X) and the foregoing active species (H) as introduced in said mixing and transportation space (2), and a film forming space being connected to said mixing and transportation space (2).

DESCRIPTION OF THE INVENTION

Figure 1:
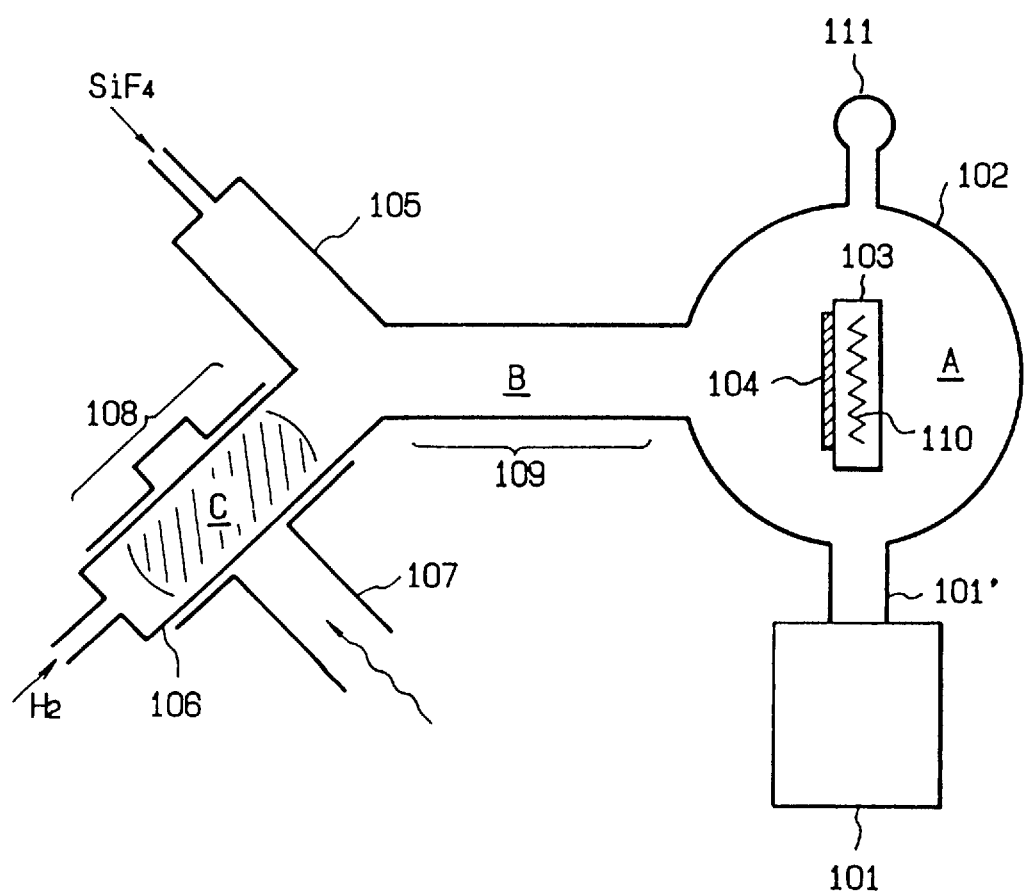
FIG. 1 is a schematic explanatory diagram of a known apparatus for the preparation of a functional deposited film.

In a typical embodiment of the process for preparing a functional deposited film according to this invention, the formation of the foregoing gaseous product (HX) capable of contributing to the formation of a functional deposited film (hereinafter referred to as "film forming material (HX)") is caused by introducing a material (X) capable of supplying atoms to be constituents for the resulting functional deposited film and an active species (H) chemically reactive with said material (X) into a mixing and transportation space being isolated from a film forming space and mixing them during their transportation toward the film forming space while purposely applying a reaction promoting energy thereinto. The film forming material thus formed is successively transported into the film forming space having a substrate being maintained at an elevated temperature therein and it is decomposed in a space surrounding the surface of the substrate to thereby cause the formation of a functional deposited film on the surface of the substrate.

As the material (X), any material may be employed as long as it is such that supplies atoms to be constituents for an objectives functional deposited film to be formed and that chemically reacts with the active species (H) to cause the formation of an objective film forming material (HX) in the mixing and transportation space. And it is desired for the material (X) to be introduced in a gaseous state into the mixing and transportation space for the reason that when it is a gaseous material, its admixture with the active species (H) and the chemical reaction among them are effectively carried out and the formation of the film forming material (HX) is effectively caused.

Further, as for the material (X), it is desired to be in an activated state when introduced into the mixing and transportation space for the reason that the admixture of the material (X) with the active species (H) and the chemical reaction among them are further effectively promoted and as a result, the formation of the film forming material (HX) is further effectively promoted.

However, the material (X) is not always necessary to be in an activated state, and it may be such that is of a so-called neutral state.

Details in this respect will be explained at later stage .

As the material (X) usable in this invention, there may be illustrated compounds containing Group IV atoms of the Periodic Table which are in the gaseous state or can be easily made to be in the gaseous state.

Desirable examples of them are such as expressed by the following general formulas (1) or (2) in which a highly electron attractive atom or atomic factor, or a polar group being bonded to Group IV atom:

$T_nX_{2n+2}$ (1),

$(TX_2)_n$ (2)

wherein n is an integer of 1, 2 or 3, T is one or more members selected from the group consisting of carbon atom (C), silicon atom (Si), germanium atom (Ge) and tin atom (Sn), and X is one or more selected from the group consisting of fluorine (F), chlorine (Cl), bromine (Br) and iodine (I).

Specific examples which are used in the neutral state are $SiF_4$, $Si_2F_6$, $Si_3F_8$, $Si_2Cl_6$, $SiF_2Cl_2$, $Si_2F_4Cl_2$, $SiBr_2F_2$, $Si_2Br_6$, $SiCl_4$, $Si_2I_6$, $GeF_4$, $GeCl_4$, $CF_4$, $CBr_4$, $C_3F_8$, $SnF_4$, $SnCl_4$, $SnBr_4$, $(SiF_2)_3$, $(SiF_2)_4$, $(SiF_2)_5$, $(Sif_2)_6$, $(GeF_2)_4$, $(GeF_2)_5$, $(GeF_2)_6$, etc.

Other than these compounds, it is possible to use such compounds as $SiH_2(C_6H_5)_2$ and $SiH(CN)_2$ in accordance with the end use of the resulting deposited film.

Among these compounds, fluorine containing compounds are desirable in this invention.

In a preferred embodiment of the material (X) to be used in the activated state in this invention, there is used such that one or more of the above-mentioned compounds have been made to be in the activated state by applying an energy such as light energy or heat energy thereon or such that is generated as a result of applying the above energy onto one or more of the above-mentioned compounds.

For instance, in the case of forming a silicon containing deposited film, it is desired to use radicals such as $SiF_2{}^*$ and the like which are generated by the glow discharge in the above-mentioned fluorine containing compound. Likewise, radicals such as $GeF_2{}^*$ are desired in the case of forming a germanium containing deposited film.

As for the active species (H) to be used in this invention, it can be generated by applying an appropriate activation energy onto relevant compound (Y). As the raw material to generate such active species (H), there may be illustrated those which are in the gaseous state or can be easily made to be in the gaseous state.

Desirable examples of them are $H_2$ or a member of compounds having the following general formulas (3) or (4):

$T_nH_{2n+2}$ (3),

$TH_nX_{4-n}$ (4)

wherein n is an integer 1, 2 or 3, and T and X have the same meanings as in the cases of the foregoing general formulas (1) and (2).

Specific examples of the compounds having the general formulas (3) and (4) are $SiH_4$, $Si_2H_6$, $Si_3H_8$, $GeH_4$, $Ge_2H_6$, $Ge_3H_8$, $CH_4$, $C_2H_6$, $C_3H_8$, $SnH_4$, $SiH_2Cl_2$, $SiH_3Cl$, $SiHF_3$, $SiHCl_3$, $SiHBr_3$, etc.

By the way, in this invention, the term "activation" at the time when the compound (Y) is activated to generate the active species (H) means that the compound (Y) is dissociated, ionized or radicalized, and among those resulted in these cases, such in the activated state is identified as the active species (H).

In a preferred embodiment with respect to the active species (H) in this invention, it is desired to use an active species containing hydrogen atom (H), or in particular, hydrogen radical (·H).

As the reaction promotion energy to be applied on the material (X) and the active species (H) being mixed while being chemically reacted in the mixing and transportation space in this invention, there may be illustrated light energy, heat energy, radiated heat energy, discharge energy and the like, among these energies, discharge energy being most preferred.

As the discharge energy, a high frequency discharge energy of radio frequency (RF) region or of microwave frequency region is desirable. Specific examples are a radio frequency discharge energy of 13.56 MHz and a microwave discharge energy of 2.45 GHz.

As for the film forming material (HX) to be resulted from the material (X) and the active species (X) in this invention, it is a member selected from the group consisting of the following (i) to (iv) materials or a mixture of two or more of them:

(i) a mixed body comprised of the material (X) and the active species (H);

(ii) a reaction product of the material (X) and the active species (H);

(iii) a dissociated product of the material (X) or a reaction product thereof; and (iv) a dissociated product of the active species (H) or a reaction product thereof And in any case, such film forming material contains one or more kinds of factors capable of directly contributing to the formation of an objective functional deposited film.

In this invention, when the foregoing reaction promotion energy is applied into the mixing and transportation space, it also serves, besides serving to promote the chemical reaction among the material (X) and the active species (H), to excite the above mixed body (i), promote the chemical reaction of causing the above reaction product (ii) and the above dissociated products (iii) and/or (iv), or further excite the above reaction product (ii) and the above dissociated products (iii) and/or (iv).

According to this invention, as above described, the film forming material (HX) contains one or more kinds of factors capable of directly contributing to the formation of an objective deposited film. And the reaction promotion energy as applied into the mixing and transportation space serves to promote the chemical reaction of the reaction system and to increase said factors in the film forming material (HX) so that the film forming material (HX) effectively supplies atoms to be constituents for an objective deposited film to be formed and/or chemical species containing such atoms onto the surface of a substrate being maintained at an elevated temperature in the film forming space.

Because of this, this invention makes it possible to repeatedly obtain an objective functional deposited film excelling in the quality and having a wealth of many practically applicable characteristics at an improved deposition rate and with an improved raw material gas utilization efficiency.

Moreover, in this invention, as the film forming space is isolated from the mixing and transportation space, an objective deposited film may be effectively formed on the surface of the substrate without having any undesired influences of the reaction promotion energy as applied into the mixing and transportation space. That is, there is not any or merely a slight occasion for said objective deposited film to be formed to have influence of bonbardment which will be resulted from ion parcetics generated in the case of using discharge energy, of over-heat which will be caused in the case of using heat energy or of light fatigue which will be caused in the case of using light energy.

As fort he conditions for generating the active species (H) by applying an activation energy onto the foregoing compound (Y) as introduced in the active species (H) generation space, they are properly determined depending upon the kind of a deposited film to be formed, the kind of the material (X) to be used, the kind of the active species (H) to be used, etc.

However, the flow rate of the foregoing compound (Y) to be fed into the active species (H) generation space is preferably 1 to 500 SCCM and more preferably, 10 to 300 SCCM.

As for the inner pressure of the active species (H) generation space in the case of generating the active species (H), it is preferably $5 \times 10^{-5}$ Torr and more preferably, $1 \times 10^{-4}$ to 5 Torr.

In the case where it is necessary to heat the foregoing compound (Y) in the active species (H) therefrom by applying an activation energy thereonto, appropriate heating method and a desired temperature are properly selected so that the active species (H) generating reaction of the compound (Y) with the application of an activation energy may be effectively caused in the active species (H) generation space.

As such heating method, there can be illustrated a method of indirectly supplying heat energy through the circumferential wall of the active species (H) generation space using electric coil heater or electric plate heater being mounted on the outer surface of said circumferential wall, a method of directly supplying heat energy onto the compound (Y) using one of said heaters being mounted within the active species (H) generation space, other than these heating methods, a known radiation heating method and a known microwave heating method. As for the heating temperature, a temperature of 50° to 1500° C. may be s electively employed upon the situation. However, in general, it is preferably 80° to 1200° C., and most preferably 80° to 1000° C.

As the activation energy to be applied in the case of generating the active species (H), any of the energies as above illustrated for the reaction promotion energy may be selectively employed. Among those energies, a high frequency discharge energy is most desirable. Specific examples of the high frequency discharge energy are a radio frequency (RF) discharge energy of 13.56 MHz and a microwave discharge energy of 2.45 GHz.

In the case of employing light energy as the activation energy to generate the active species (H) from the compound (Y) in the active species (H) generation space, an appropriate light energy applying source such as high-pressure mercury-vapor lamp, tungsten halogen lamp, laser beam source or t he like is so provided withe active species (H) generation space that a proper light energy is effectively applied into the active species (H) generation space from the outside.

In this case, it is necessary for the wall member of the active species (H) generation space to be made of a light transmissive material at least with its part through which the light energy may be applied into the active species (H) generation space. As such light transmissive material, there may be illustrated quartz glass, transparent ceramics, etc.

In the case of introducing the material (X) into the mixing and transportation space, the material (X) is supplied from the material (X) supplying space being situated in the upstream side of the mixing and transportation space.

In a preferred embodiment of this invention, as the material (X) to be introduced into the mixing and transportation space, it is desired to use the foregoing activated state material (X) (hereinafter referred to as "material($X^*$)") and other materials derived from the material (X) (hereinafter referred to as "material (X) derivative") which are generated by applying an activation energy onto the material (X), namely, one or more raw materials selected from the compounds represented by the above-mentioned general formulas (1) and (2).

In this case, the material (X) supplying space is desired to be so structured to have an activation space to generate the above material ($X^*$) or/and the above material (X) derivative (hereinafter referred to as "material (X) activation space") with which a means of applying said activation energy being provided. As for the source for such activation energy, an appropriate energy source is selectively used depending upon the kind of the material (X) to be used and the activation conditions to be employed. However, as such activation energy, any of those to be employed in the case of generating the active species (H) may be properly and selectively employed. Among such activation energies, a high frequency discharge energy such as a radio frequency (RF) discharge energy of 13.56 MHz and a microwave discharge energy of 2.45 GHz is particularly desireble.

In the case of employing such high frequency discharge energy in order to generate the foregoing material ($X^*$) or/and the foregoing material(X) derivative in the material (X) activation space, its discharge power is properly determined in accordance with the kind of a raw material selected from the compounds represented by the above-mentioned general formula (1) and (2) to be used, the kind of an apparatus to be used, etc. However, it is preferably 50 to 100 W/cm$^2$ and more preferably, 80 to 800 W/cm$^2$.

As for the flow rate for the material (X) to be fed into the material (X) activation space, it is preferably 1 to 500 SCCM, and more preferably, 10 to 300 SCCM.

In this embodiment, a gaseous material to be resulted as a result of applying an activation energy in the material (X) activation space will be usually a gaseous mixture of the material (X*), the material (X) derivative and the material (X). Such gaseous mixture thus resulted will be successively transported into the mixing and transportation space where it will mixed and reacted with the active species (H) as concurrently introduced therein to while receiving the action of the foregoing reaction promotion energy.

In this case, in addition to said gaseous material, it is possible to independently introduce the material (X) into the mixing and transportation space through an appropriate feeding means.

As the reaction promotion energy to be employed in this case, a high frequency discharge energy as such mentioned above is most appropriate, and its discharge power is preferably 10 to 800 W/cm$^2$, and more preferably, 30 to 500 W/cm$^2$.

In this invention, as for the amount of the material (X), the amount of the aforesaid gaseous mixture or the sum amount of the aforesaid gaseous mixture and the material (X) to be introduced into the mixing and transportation space and also as for the amount of the active species (H) to be introduced into the mixing and transportation space, they are properly determined in accordance with the shape, size and arrangement of the mixing and transportation space, the kinds of the raw materials to be used, the kind of the reaction promotion energy to be employed, etc.

However, in any case, the flow ratio of the former raw material represented by the material (X) to the latter raw material, that is, the active species (H) is adjusted to preferably 1/100 to 100/1, or more preferably, to 1/50 to 80/1.

As for the inner pressure of the film forming space at the time when a deposited film is formed on a substrate in this invention, it is properly determined depending upon the kind of said film to be formed and the characteristics desired for the resulting film.

However, it is preferably 0.01 to 10 Torr, and more preferably, 0.05 to 8 Torr.

As for the substrate temperature, it is property determined also depending upon the above related items.

However, it is preferably 80° to 450° C., and more preferably, 100° to 350° C.

In order to carry out the above-mentioned process for preparing a functional deposited film according to this invention, there is used an appropriate apparatus suited therefor as much shown in FIG. 3, FIG. 4, FIG. 5 or FIG. 6.

Figure 3:
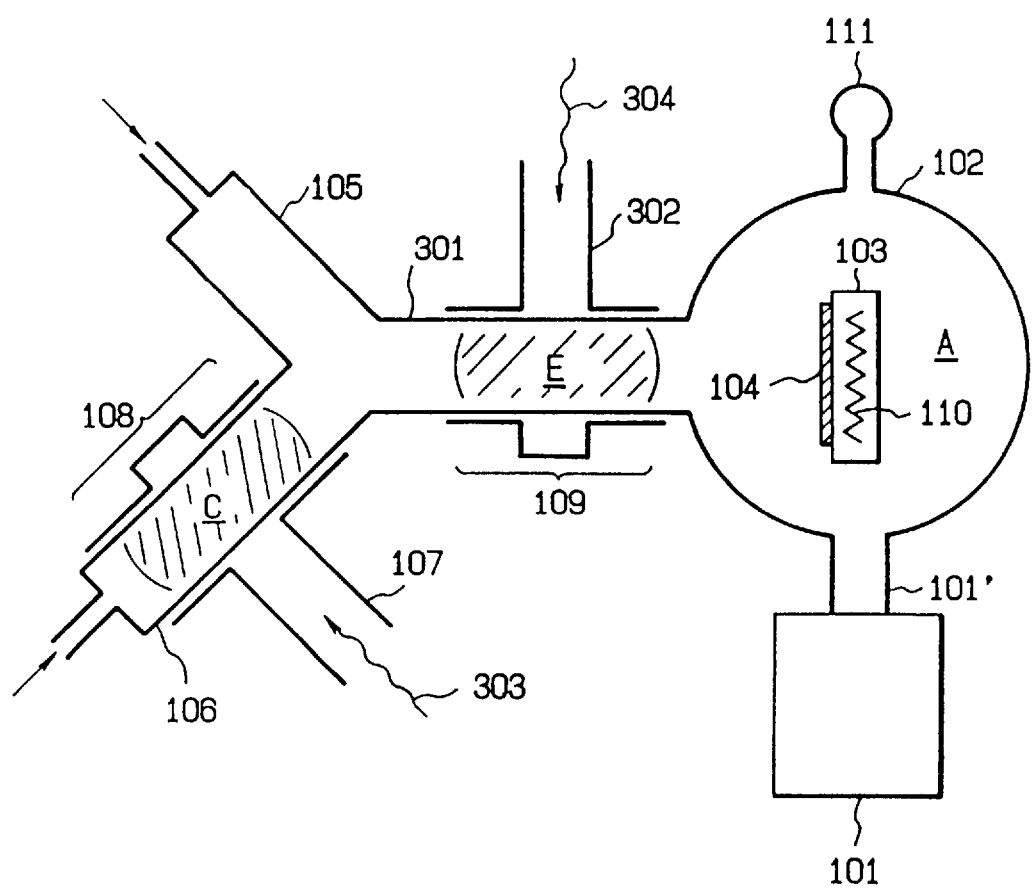
FIG. 3, FIG. 4, FIG. 5 and FIG. 6 are schematic explanatory diagrams of apparatuses suitable for carrying out the process for the preparation of a functional deposited film according to this invention.

FIG. 3 is a schematic explanatory diagram of a first representative apparatus according to this invention which is a modification of the known apparatus shown in FIG. 1. Therefore, in FIG. 3, there are used the same numerals and the same as in FIG. 1 for the unchanged parts. As shown in FIG. 3, the modified part 109 of the known apparatus of FIG. 1 comprises a mixing and transportation pipe 301 having a space E for mixing and transporting the material (X) and the active species (H) as flowed therein to while effectively causing the chemical reaction among them with the action of a reaction promotion energy (for example, a high frequency discharge energy) applied through the circumferential wall of the mixing and transportation pipe 301 from a reaction promotion energy application means, that is, a microwave introducing applicator 302 of a microwave 304 transmitted from a microwave power source (not shown) which is mounted with the outer face portion of the circumferential wall of the mixing and transportation pipe 301.

In more detail of this respect, for example, a microwave 304 of 2.45 GHz in frequency is applied with a desired power through the microwave introducing applicator 302 into the mixing and transportation space E to thereby cause a discharge in a gaseous atmosphere containing the material (X) and the active species (H) therein.

At the upstream portion of the mixing and transporation pipe 301, there are jointed a material (X) transportation pipe 105 and an active species (H) generation and transportation pipe 106 so as to allow a material (X) and an active species (H) to be flowed into the space E.

Numeral 108 stands for a active species (H) generation region which comprises the active species (H) generation and transportation pipe 106 to which a feed pipe for a raw material gas for the generation of the active species (H) extended from a reservoir (not shown) and an activation energy introducing applicator 107 of an activation energy source 303 (for example, a high frequency power) from a power source (not shown). To the material ((X) transportation pipe 105, there is connected a feed pipe of a raw material gas for the material (X) extended from a reservoir (not shown).

Numeral 102 stands for a film forming chamber into which the mixing and transportation pipe 301 being open at its down stream end.

The film forming chamber 102 has a film forming space A in which a substrate holder 103 for substrate 104 having electric heater 110 being connected to a power source (not shown) by means of lead wires (not shown) is installed.

The film forming chamber 102 is provided with exhaust pipe 101' connected through a main valve (not shown) to an exhaust pump 101, and the exhaust pipe is provided with a subsidiary valve (not shown) serving to break the vacuum in the film forming chamber 102. Numeral 111 stands for a vacuum gauge to monitor the inner pressure of the film forming space A.

Figure 2:
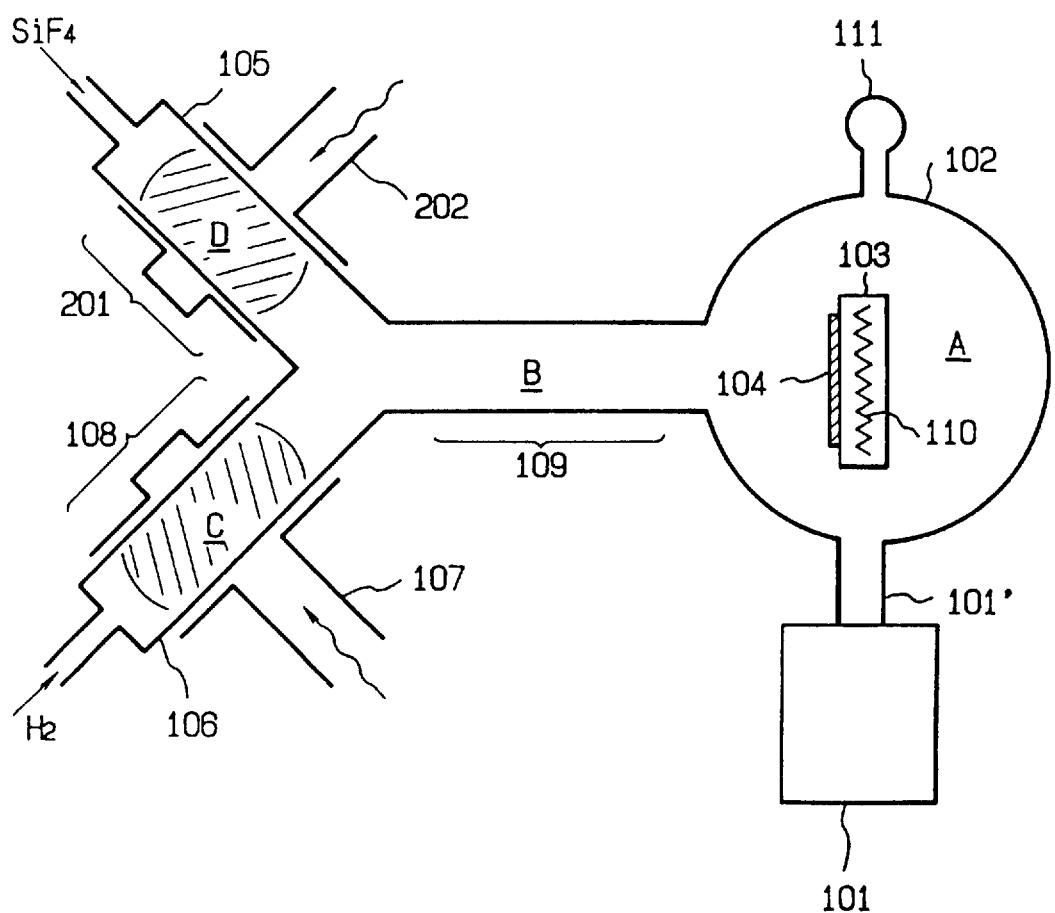
FIG. 2 is a schematic explanatory diagram of another known apparatus for the preparation of a functional deposited film.
Figure 4:
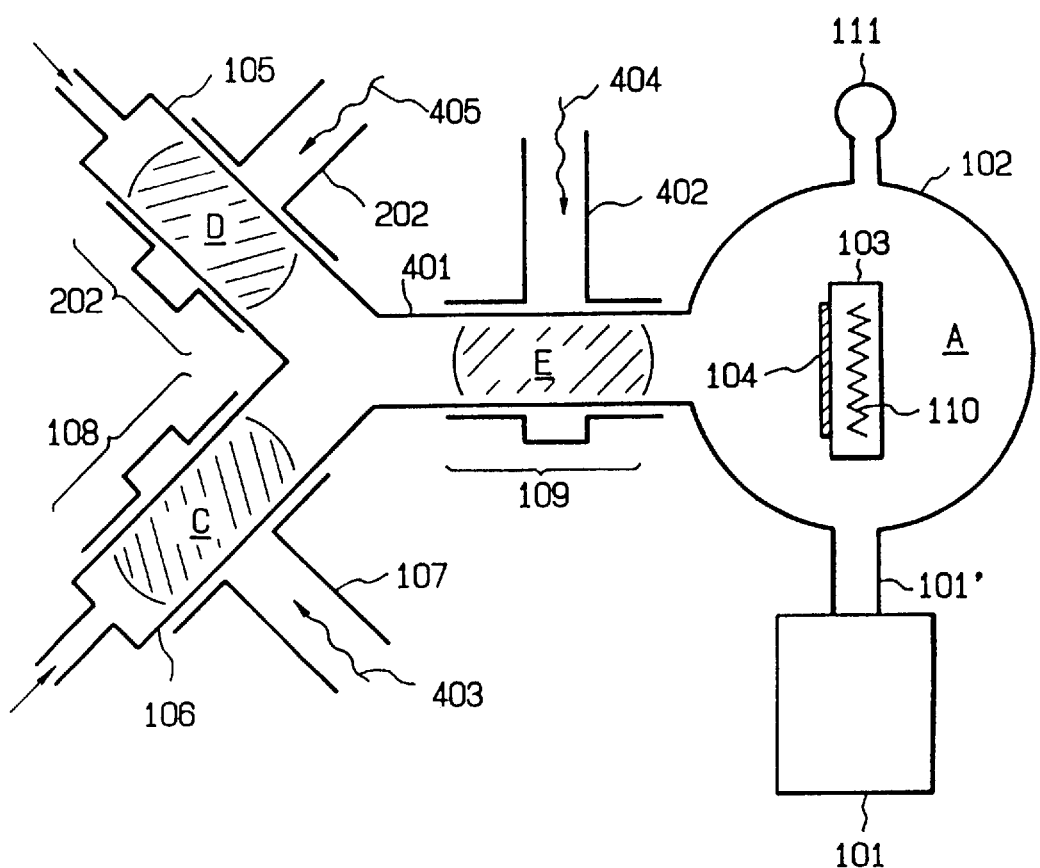

FIG. 4 is a schematic explanatory diagram of a second representative apparatus according to this invention which is a modification of the known apparatus of FIG. 2. The modification is that the pipe portion 109 having the space B in the known apparatus of FIG. 2 is replaced by a mixing and transportation pipe 301 having a space for mixing and transporting the material (X) and the active species (H) as flowed therein to while effectively causing the chemical reaction among them with the action of a reaction promotion energy (for example, a high frequency discharge energy) applied through the circumferential wall of the mixing and transportation pipe 301 from a reaction promotion energy application means, that is, a microwave introducing applicator 302 of a microwave 304 transmitted from a microwave power source (not shown) which is mounted with the outer face portion of the circumferential wall of the mixing and transportation pipe 301.

And other parts of the apparatus shown in FIG. 4 according to this invention has the same structure as the apparatus shown in FIG. 3.

Figure 5:
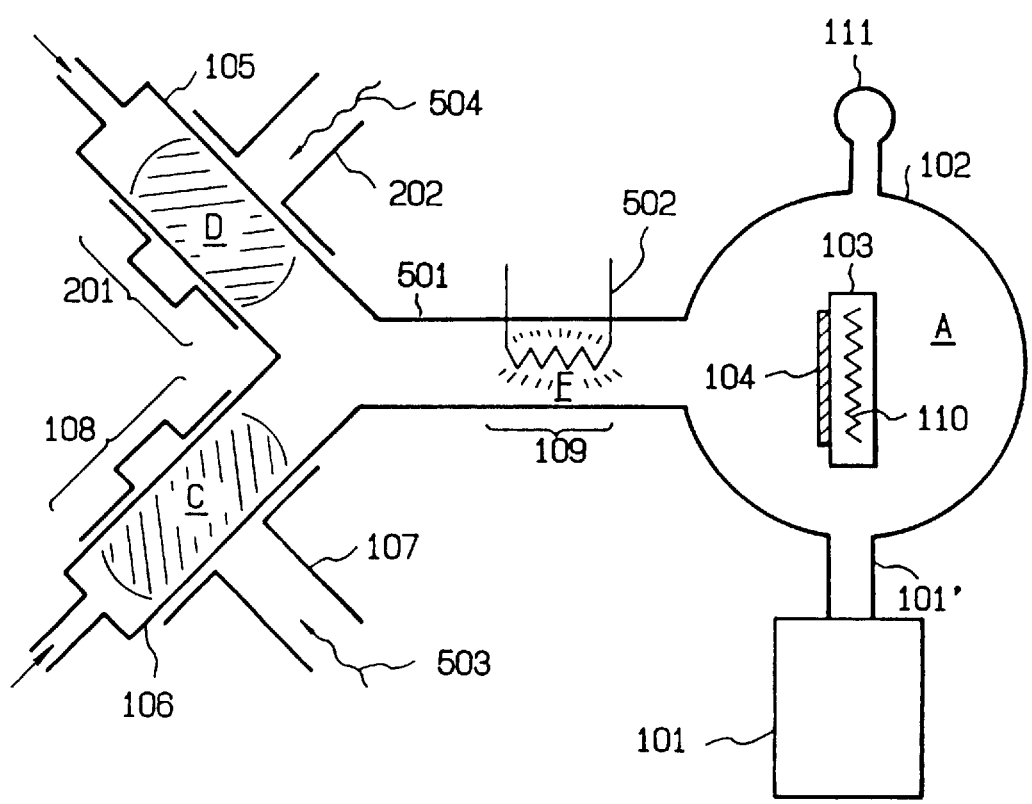

FIG. 5 is a schematic explanatory diagram of a third representative apparatus according to this invention which is a modification of the apparatus of FIG. 4.

The modified is that the microwave introducing applicator 302 is replaced by a tungusten filament 502 of supplying an incandescence energy as the reaction promotion energy. That is, in FIG. 5, numeral 501 stands for a mixing and transportation pipe having a mixing and transportation space F. The tungusten filament 502 is provided in the space F. The tungusten filament 502 is electrically connected through lead wires to a power source (not shown).

Figure 6:
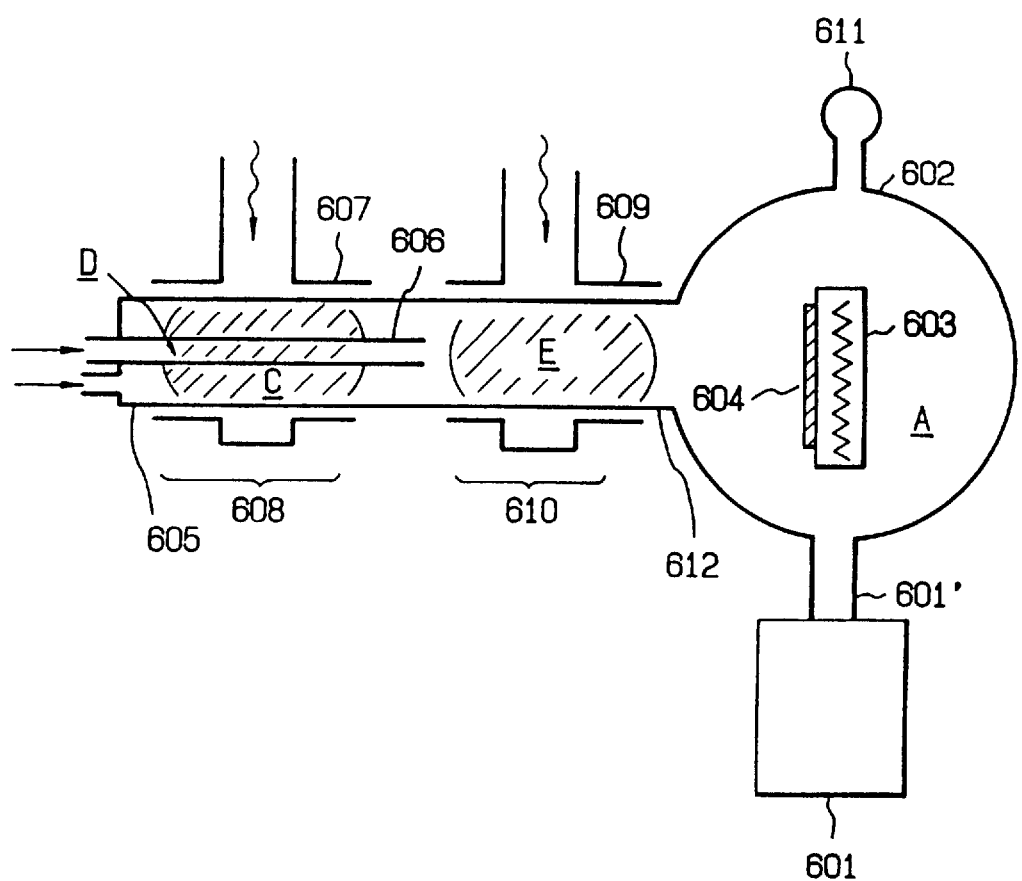

FIG. 6 is a schematic explasnatory diagram of a fourth representative apparatus according to this invention.

The fabrication apparatus of FIG. 6 comprises a film forming chamber 602 having a film forming space A and a film forming raw material gas transportation pipe 605 being open into the film forming space A at its terminal end.

The film forming chamber 602 is provided with an exhaust pipe 601' connected through a main valve (not shown) to an exhaust pump 601, and the exhaust pipe is provided with a subsidiary valve (not shown). The film forming chamber 602 is also provided with a vacuum gauge 611 to serve for monitoring the inner pressure of the film forming space A. In the film forming space A of the film forming chamber 602, there is provided a holder 603 for a substrate 604, in which an electric heater 603' being electrically connected to a power source by means of lead wires (not shown) is installed.

The transportation pipe 605 has a raw material gas activation region 608 at its upstream portion and a mixing region 610 at its downstream portion. The mixing region has a space E serving for mixing and transporting the active species (H) and the material (X) as flowed therein to with the action while effectively causing the chemical reaction among them with the action of a reaction promotion energy (for example, a high frequency discharge energy) applied through the circumferential wall of the transportation pipe 605 from a reaction promotion energy application means, that is, a microwave introducing applicator 609 of a microwave transmitted from a microwave power source (not shown) which is mounted with the outer face portion of the circumferential wall of the transportation pipe 605 lying in the mixing region 610. The space E in the mixing region 610 is so provided as to terminate before the opening of the transportation pipe 605 into the film forming space A with leaving a desired non-plasma space 612. The upstream portion of the transportation pipe 605 in the activation region 608 has a double conduit structure having a middle conduit 606 for transporting the material (X) being horizontally situated therein and being open in a space adjacent to the space E at its end. To the other end of the middle conduit 606, there is connected a feed pipe extended from a reservoir for the material (X) (this part is not shown). The middle conduit 606 has a space D which serves for transporting a gaseous raw material of the material (X) and optionally for activating said material. C indicates an outer cylindrical circular space formed by the circumferential wall of the transportation pipe 605 lying in the activation region 608 and the outer wallface of the circumferential wall of the middle conduit 606, which serves not only for transporting a gaseous raw material (Y) through a feed pipe therefor being extended from a reservoir for said material (Y) (this part is not shown) but also for generating the active species therefrom with the action of an activation energy applied through the circumferential wall of the above transportation pipe 605 from an activation energy application means (applicator) 607 which is mounted with the outer wallface portion of the circumferential wall of the above transportation pipe 605.

In the apparatus of FIG. 6 of this invention, it is possible to activate a gaseous raw material for the active species (H) and a gaseous raw material for the material (X) in the activated state or in other states. In this case, the middle conduit 606 is made such that is made of an dielectric material such as quartz.

And in the apparatus of FIG. 6 of this invention, it is possible to use the middle conduit 606 for a gaseous raw material and the remaining for a gaseous raw material for the material (X).

The film formation process to form a A-Si:H:F deposited thin film o n the substrate 104 using the first representative fabrication apparatus of FIG. 4 according to this invention is carried out, for example, in the following way.

That is, the film forming chamber 102, the film forming raw material gas transportation pipe 105 and the active species (H) gene ration space C is evacuated by opening the main valve of the exhaust pipe 101' to bring the chamber and other spaces to a desired vacuum. Then the heater 110 is activated to uniformly heat the substrate 104 to about 300° C., and it is kept at this temperature. At the same time, $SiF_4$ gas is fed at a flow rate of 30 SCCM into the transportation pipe 105 and then into the film forming space A through the space E. Concurrently, $H_2$ gas is fed at a flow rate of 20 SCCM into the active species (H) generation space C and then into the film forming space A through the space E. After the flow rates of the two gases became stable, the vacuum of the film forming space A is brought to and kept at 0.5 Torr by regulating the main valve of the exhaust pipe 101'.

After the vacuum of the film forming space A became stable, the microwave power source is switched on to apply a discharge energy of a desired power into the active species (H) generation space C through the microwave energy applying applicator 107.

Concurrently, the microwave power source is switched on to apply a discharge energy of a desired power into the space E through the microwave energy applying applicator 302.

In this case, the active species (H) i.e. $H^*$ (hydrogen radical), deactivated material, such as $H_2$ and H caused therefrom during transportation and the remaining unactivated $H_2$ gas arrive in the space E, where they are mixed with $SiF_4$ as flowed from the transportation pipe 105 while being chemically reacted by the discharge in a mixture of said materials to thereby effectively afford a reaction product (HX), which is successively introduced into the film forming space A. As a result, there is formed a A-Si:H:F thin film on the substrate 104 at a high deposition rate and with a high raw material gas utilization efficiency.

The film forming process using the apparatus shown in FIG. 4 to form, for example, a A-Si:C:H:F thin film is carried out in the following way.

That is, the film forming chamber 102, the space D and the space C are evacuated by opening the main valve of the exhaust pipe 101' to bring the chamber and other spaces to a desired vacuum. Then the heater 110 is activated to uniformly heat the substrate 104 to about 300° C., and it is kept at this temperature. At the same time, $SiF_4$ gas and $CF_4$ gas are fed at respective flow rates of 10 SCCM and 30 SCCM into the space D and then into the film forming space A through the space E. Concurrently, $H_2$ gas is fed at a flow rate of 20 SCCM into the space C and then into the film forming space A through the space E. After the flow rates of the above gases became stable, the vacuum of the film forming space A is brought to and kept at about 0.5 Torr by regulating the main valve of the exhaust pipe 101'.

After the vacuum of the film forming space A became stable, the microwave power source is switched on to apply a discharge energy of a desired power into the space C through the microwave energy applying applicator 107 to generate the active species (H), i.e. $H^*$ (hydrogen radical), which is successively flowed into the space E.

At the same time, the microwave power source is switched on to apply a discharge energy of a desired power into the space D through the microwave energy applying applicator to thereby activate $SiF_4$ and $CF_4$ to generate fluorine series radicals such as $SiF_2^*$ from $SiF_4$ and another kinds of series radicals such as $CF_2^*$ from $CF_4$, which are also successively flowed into the space E.

In t he above space C, the $H_2$ gas as introduced therein is almost converted to hydrogen radical ($H^*$). However, as above described, some of the $H_2$ gas will be remained without activated therein and is flowed into the space E. And some of the hydrogen radical will be deactivated to be $H_2$, H, etc. during transportation to the space E, and such deactivated materials are also flowed into the space E.

Therefore, a mixture of the hydrogen radical ($H^*$), deactivated materials caused therefrom and the remaining unactivated $H_2$ gas is flowed into the space E.

As for the above $SiF_4$ gas and $CF_4$ gas, they are almost activated in the space D. However, some of them will be remained without activated therein.

And some of the activated products will be deactivated to return to the original $SiF_4$ and $CF_4$ during their transportation to the space E. In this respect, a mixture of radicals ($SiF_2^*$, $CF_2^*$, etc.), $SiF_4$ and $CF_4$ is flowed into the space E. The materials thus arrived in the space E are mixed while being chemically reacted by the discharge in a mixture of said materials to thereby effectively afford a reaction product (HX), which is successively introduced into the film forming space. As a result, there is formed a A-Si:C:H:F thin film on the substrate 104 at a high deposition rate and with a high raw material gas utilization efficiency.

The film forming process using the apparatus shown in FIG. 5 and that using the apparatus shown in FIG. 5 are carried out in a similar way as in the case of using the apparatus shown in FIG. 4. And, in any of these cases, there may be formed a desired thin film at a high deposition rate and with a high raw material utilization efficiency.

As above detailed, according to this invention, a film forming material (HX) capable of directly contributing to the formation of a functional deposited thin film on a substrate in an substantially enclosed film forming space is firstly formed by mixing and chemically reacting the derivatives caused from the material (X) and the active species (H) as separately introduced while applying a reaction promotion energy in a substantially enclosed space isolated from the film forming space, and the film forming material (HX) thus formed is successively introduced into the film forming space wherein a substrate being maintained at an elevated temperature, to thereby form an objective functional deposited thin film on the surface of the substrate. Because of this, raw material gases used are entirely and effectively consumed in forming the film forming material (HX) in the foregoing space situated before the film forming space, and it becomes possible to repeatedly produce a high quality functional deposited film at a high deposition rate and with a high raw material gas utilization efficiency.

PREFERRED EMBODIMENT OF THE INVENTION

The advantages of this invention are now described in more detail by reference to the following Examples, which are provided merely for illustrative purposes only, and are not intended to limit the scope of this invention.

In the following Examples, the term "microwave" means such that is of a frequency of 2.45 GHz except otherwise defined.

EXAMPLE 1

There was prepared a A-Si:H:F thin deposited film using the fabrication apparatus shown in FIG. 3. As the substrate 104, there was used a Corning's glass plate (product of Corning Glass Works Inc., USA).

The glass plate substrate was treated with a 1% solution of NaOH, washed with water, and then air-dried. This glass plate substrate was then firmly attached to the surface of the substrate holder 103 in the film forming chamber 102.

The film forming space A, the film forming raw material gas transportation pipe 105 and the space C were evacuated by opening the main valve of the exhaust pipe 101'to bring the film forming space and other spaces to a vacuum of $1 \times 10^{-5}$ Torr. Then the heater 110 was activated to uniformly heat the substrate 104 to about 300° C., and it was kept at this temperature. At the same time, $SiF_4$ gas was fed at a flow rate of 30 SCCM into the transportation pipe 105 and then into the film forming space A through the space B. Concurrently, $H_2$ gas was fed at a flow rate of 20 SCCM into the active species (H) generation space C and then into the film forming space A through the space B. After the flow rates of the two gases became stable, the vacuum of the film forming space A was brought to and kept at a vacuum of about 0.5 Torr by regulating the main valve of the exhaust pipe 101'.

After the vacuum of the film forming space A became stable, the microwave power source was switched on to apply a microwave energy of a power of 200 W/cm² into the active species (H) generation space C through the microwave energy applying applicator 107.

Concurrently, the microwave power source was switched on to apply a microwave energy of 50 W/cm² into the space E through the microwave energy applying applicator 302. After this state being maintained for about 90 minutes, there was deposited a A-Si:H:F film (Sample No. 1-1B) on t he glass plate substrate 104.

The above procedures were repeated to thereby prepare further four samples (Samples Nos. 1-2B to 1-5B).

Then, there were prepared five comparative samples (Samples Nos. 1-1A to 1-1A) by repeating the above procedures except that there was not applied any reaction promotion energy into the space E.

As for every resultant sample, there were examined a deposition rate D.R. (Å/sec.), a raw material gas utilization efficiency and a dark conductivity $\sigma d(\Omega^{-1}cm^{-1}$ The results obtained were shown in Table 1.

In other experiment, it was tried to form a A-Si:H:F film by repeating the foregoing procedures except that there was not applied any activation energy into the active species (H) generation space but there was applied a microwave energy of 200 W/cm² into the space E.

However, there was not found any film deposition on the glass plate substrate.

As Table 1 illustrates, it is understood that there are unevennesses in the deposition rate (D.R.) and the dark conductivity ($\sigma d$) among the five comparative samples 1-1A to 1-5A and it is questionable to repeatedly and stably obtain a desired functional deposited film of uniform quality by way of the known process.

On the other hand, as for the five samples 1-1B to 1-5B prepared according to the process of this invention, it is found that there are desired evennesses in the deposition rate (D.R.) and the dark conductivity among all the five samples and because of this, the process of this invention makes it possible to mass-produce a desired functional deposited film of uniform quality. In addition to this, it is also understood that the deposition rate in the case of the process according to this invention is larger than that in the case of the known process and the raw material gas utilization efficiency in the case of the process according to this invention is significantly large by 7.7 to 129% over that in the case of the known process.

EXAMPLE 2

The procedures of Example 1 according to this invention were repeated, except that the flow rate of $SiF_4$ gas and that of $H_2$ gas were changed to 30 SCCM and 50 SCCM respectively, and a microwave energy of 100 W/cm² as the reaction promotion energy was supplied into the space E, to thereby prepare five samples (Samples Nos. 2-1B to 2-5B).

Then, the procedures of Example 1 according to the known process for the preparation of a comparative sample were repeated except that the flow rate of $SiF_4$ gas and that of $H_2$ gas were changed to 30 SCCM and 50 SCCM respectively, to thereby prepare five comparative samples (Samples Nos. 2-1A to 2-5A).

As a result of examining the dark conductivity ($\sigma d$) and the activated energy (Ea) for every sample, there were obtained the results as shown in Table 2.

And as a result of conducting the observation of a RHEED image (reflection high energy electron diffusion image in accordance with a conventional method, it was found as for the five Samples Nos. 2-1B to 2-5B prepared according to the process of this invention that there is obtained an uniform spot image for any of the Samples Nos. 2-1B to 2-5B and every sample is of a polycrystal-Si:H:F film excelling in orientation. On the other hand, as for the Samples Nos. 2-1A to 2-5A prepared by way of the known process, it was found that there appearing images for some of them and spot images for some of them and because of this, it is difficult to repeatedly and stably prepare a deposited film of uniform quality.

EXAMPLE 3

There was prepared a A-Si:C:H:F thin deposited film using the fabrication apparatus shown in FIG. 4.

The film forming space A, the space C and the space D were evacuated by opening the main valve of the exhaust pipe 101' to bring the chamber and other spaces to a vacuum of $1 \times 10^{-5}$ Torr. Then the heater 110 was activated to uniformly heat the substrate 104, to about 300° C., and it was kept at this temperature. At the same timer, $SiF_4$ gas and $CF_4$ gas were at respective flow rates of 10 SCCM and 30 SCCM into the space D and then into the film forming space A through the space B. Concurrently, $H_2$ gas was fed at a flow rate of 20 SCCM into the space C and then into the film forming space A through the space B. After the flow rates of the above gases became stable, the vacuum of the film forming space A was brought to and kept at a vacuum of about 0.7 Torr by regulating the main valve of the exhaust pipe 101'.

After the vacuum of the film forming space A became stable, the microwave power source was switched on to apply a microwave energy of 200 W/cm² into the space C through the microwave energy applying applicator 107.

At the same time, the microwave power source was switched on to apply a microwave energy of 200 W/cm² into the space D through the microwave energy applying applicator 202.

Concurrently, the microwave power source was switched on to apply a microwave energy of 100 W/cm² into the space E through the microwave energy applying applicator 402. After this state being maintained for about 2 hours, there was deposited a A-Si:C:H:F film (Sample No. 3-1B) on a glass plate substrate.

The above procedures were repeated to thereby prepare further four samples (Samples Nos. 3-2B to 3-5B).

Then, there were prepared five comparative samples (Samples Nos. 3-1A to 3-5A) by repeating the above procedures except that there was not applied any reaction promotion energy into the space E.

As a result of examining an optical band gap Egopt(eV) and deposition rate D.R.(Å/sec.) on every resultant sample, there were obtained the results as shown in Table 3.

As Table 3 illustrates, it is understood that the Samples Nos. 3-1B to 3-5B are all superior to the comparative Samples Nos. 3-1A to 3-5A with respect to every evaluation item.

In addition it was found that the raw material gas utilization efficiencies in the preparation of the Samples Nos. 3-1B to 3-5B are superior by 16.7 to 117% to those in the preparation of the comparative Samples Nos. 3-1A to 3-5A.

EXAMPLE 4

In this example, there was used the fabrication apparatus shown in FIG. 5.

That is, the procedures of Example 3 according to this invention were repeated, except that the application of a reaction promotion energy into the space F was carried out by means of the tungusten filament 502 to which an electric current of 5A being flowed, to thereby prepare five ASi:C:H:F film samples (Samples Nos. 4-1B to 4-5B).

Then, the above procedures were repeated, except that there was not supplied the above reaction promotion energy into the space F, to thereby prepare five comparative samples (Samples Nos. 4-1A to 4-5A).

Every resultant sample was evaluated by way of the evaluation procedures. As a result, there were obtained similar results to those shown in Table 3.

EXAMPLE 5

There was prepared a A-Si:H:F thin film deposited film using the fabrication apparatus shown in FIG. 6.

That is, the film forming space A, the space C and the space D were evacuated by opening the main valve of the exhaust pipe 601' to bring the chamber and other spaces to a vacuum of about $1 \times 10^{-5}$ Torr. Then the heater 603' was activated to uniformly heat the substrate 604 to about 300° C., and it was kept at this temperature. At the same time, $SiF_4$ gas was fed at a flow rate of 30 SCCM into the space D and then into the film forming space A through the space E. Concurrently, $H_2$ gas was fed at a flow rate of 20 SCCM into the space C and then into the film forming space A through the space E. After the flow rates of the two gases became stable, the vacuum of the film forming space A was brought to and kept at a vacuum of about 0.7 Torr by regulating the main valve of the exhaust pipe 601'.

After the vacuum of the film forming space A became stable, the microwave power source was switched on to apply a microwave energy of 200 W/cm² into the space C through the microwave energy applying applicator 607.

Concurrently, the microwave power source was switched on to apply a microwave energy of 50 W/cm² into the space E through the microwave energy applying applicator 609.

After this state being maintained for 90 minutes, there was deposited a A-Si:H:F film (Sample No. 5-1B).

The above procedures were repeated to thereby prepare further four samples (Samples Nos. 5-2B to 5-5B).

Then, there were prepared five comparative samples (Samples Nos. 5-1A to 5-5A) by repeating the above procedures except that there was not applied any reaction promotion energy into the space E.

Every resultant sample was evaluated in accordance with the evaluation procedures in Example 1.

As a result, there were obtained quite similar results to those in Example 1.

TABLE 1

| Comparative Sample No. | In the case where microwave was not applied | | Sample No. | In the case where microwave of 50 W/cm$^2$ was applied | | *Increase proportion in raw material gas utilization (%) |
| --- | --- | --- | --- | --- | --- | --- |
| | σd(Ω$^{-1}$cm$^{-1}$) | D.R. (Å/sec) | | σd(Ω$^{-1}$cm$^{-1}$) | D.R. (Å/sec) | |
| 1-1A | 1 × 10$^{-9}$ | 1.2 | 1-1B | 1 × 10$^{-9}$ | 1.5 | 25 |
| 1-2A | 5 × 10$^{-6}$ | 0.8 | 1-2B | 2 × 10$^{-9}$ | 1.5 | 87.5 |
| 1-3A | 2 × 10$^{-5}$ | 0.7 | 1-3B | 5 × 10$^{-10}$ | 1.6 | 129 |
| 1-4A | 2 × 10$^{-9}$ | 1.2 | 1-4B | 8 × 10$^{-10}$ | 1.5 | 25 |
| 1-5A | 5 × 10$^{-10}$ | 1.3 | 1-5B | 2 × 10$^{-9}$ | 1.4 | 7.7 |

*relative figure against the figure in the comparative sample

TABLE 2

| Comparative Sample No. | In the case where microwave was not applied | | Sample No. | In the case where microwave of 100 W/cm$^2$ was applied | |
| --- | --- | --- | --- | --- | --- |
| | σd(Ω$^{-1}$cm$^{-1}$) | E$_a$ (eV) | | σd(Ω$^{-1}$cm$^{-1}$) | E$_a$ (eV) |
| 2-1A | 2.0 × 10$^{-5}$ | 0.42 | 2-1B | 2.0 × 10$^{-3}$ | 0.15 |
| 2-2A | 5.0 × 10$^{-4}$ | 0.19 | 2-2B | 1.0 × 10$^{-3}$ | 0.17 |
| 2-3A | 3.0 × 10$^{-3}$ | 0.13 | 2-3B | 2.5 × 10$^{-3}$ | 0.14 |
| 2-4A | 5.0 × 10$^{-6}$ | 0.52 | 2-4B | 8.0 × 10$^{-4}$ | 0.16 |
| 2-5A | 4.0 × 10$^{-5}$ | 0.38 | 2-5B | 1.3 × 10$^{-3}$ | 0.17 |

TABLE 3

| Comparative Sample No. | In the case where microwave was not applied | | Sample No. | In the case where microwave of 100 W/cm$^2$ was applied | | *Increase proportion in raw material gas utilization (%) |
| --- | --- | --- | --- | --- | --- | --- |
| | E$_{gopt}$ (eV) | D.R. (Å/sec) | | E$_{gopt}$ (eV) | D.R. (Å/sec) | |
| 3-1A | 2.1 | 1.2 | 3-1B | 2.2 | 1.4 | 16.7 |
| 3-2A | 1.9 | 0.7 | 3-2B | 2.2 | 1.3 | 85.7 |
| 3-3A | 1.8 | 0.6 | 3-3B | 2.1 | 1.3 | 117 |
| 3-4A | 2.0 | 1.0 | 3-4B | 2.2 | 1.4 | 40 |
| 3-5A | 1.9 | 1.0 | 3-5B | 2.1 | 1.3 | 30 |

*relative figure against the figure in the comparative sample

What we claim is:

1. A process for forming a functional deposited film on a substrate, said process comprising the steps of:
- (a) applying an energy to a first gaseous material (X) in a first reaction space to form a derivative (X') of said gaseous material (X), each of said first gaseous material (X) and derivative gaseous material (X') being comprised of silicon or germanium atoms capable of constituting said deposited film;
- (b) activating a second gaseous material (A) by applying a microwave energy from a source to said second gaseous material (A) in a second reaction space to form an active species (H), said active species (H) being reactive with at least one of said first gaseous material (X) or said derivative gaseous material (X');
- (C) forming a gaseous reaction product (HX) in a third space by mixing said first gaseous material (X) and said derivative gaseous material (X') with said active species (H) in said third space while supplying a reaction promotion energy comprising a microwave energy from a source different from the source supplying the microwave energy to said second gaseous material (A) to said mixture of said first gaseous material (X), said derivative gaseous material (X') and said active species (H), said third space having an introduction portion for introducing said materials (X,X', H) and a successive region for mixing said materials (X,X', H); and
- (d) introducing said reaction product (HX) into a substantially enclosed film-forming space which is different from but connected to said third space such that said reaction product (HX) is directed to said substrate positioned in said film-forming space while being maintained at a desired temperature, to form said functional deposited film on said substrate.

2. The process according to claim 1, wherein the first gaseous material (X) is at least one member selected from the group consisting of SiF$_4$, Si$_2$F$_6$, Si$_3$F$_8$, SiCl$_4$, Si$_2$Cl$_6$, SiF$_2$Cl$_2$, Si$_2$F$_4$Cl$_2$, SiBr$_2$F$_2$, Si$_2$Br$_6$, Si$_2$I$_6$, GeF$_4$, GeCl$_4$, (SiF$_2$)$_3$, (SiF$_2$)$_4$, (SiF$_2$)$_5$, (SiF$_2$)$_6$, (GeF$_2$)$_4$, (GeF$_2$)$_5$, and $(GeF_2)_6$; and the second gaseous material (A) is at least one member selected from the group consisting of $H_2$, $SiH_4$, $Si_2H_6$, $Si_3H_8$, $GeH_4$, $Ge_2H_6$, $Ge_3H_8$, $CH_4$, $C_2H_6$, $C_3H_8$, $SnH_4$, $SiH_2Cl_2$, $SiH_3Cl$, $SiHF_3$, $SiHCl_3$, and $SiHBr_3$.

3. The process according to claim 1, wherein the second gaseous material (A) is hydrogen gas.

* * * * *

UNITED STATES PATENT AND TRADEMARK OFFICE
CERTIFICATE OF CORRECTION

PATENT NO. : 5,874,350

DATED : February 23, 1999

INVENTOR(S) : KATSUMI NAKAGAWA

Page 1 of 4

It is certified that error appears in the above-identified patent and that said Letters Patent is hereby corrected as shown below:

COLUMN 1

Line 32, "chemicals" should read --chemical--.

COLUMN 2

Line 37, "reaction" should read --reaction among--.

COLUMN 3

Line 20, "t he" should read --the--; and
Line 60, "are" (both occurrences) should read --is--.

COLUMN 4

Line 31, "result ," should read --result,--;
Line 37, "occurs" should read --occur--;
Line 43, "an" should read --a--;
Line 52, "i n" should read --in--;
Line 59, "decmposed" should read --decomposed--; and
Line 64, "ASi:H:F" should read --A-Si:H:F--.

COLUMN 5

Line 13, "an" should read --a--; and
Line 32, "have" should read --have an--.

COLUMN 7

Line 15, "objectives" should read --objective--;
Line 35, "stage ." should read --stage.--; and
Line 58, "$(Sif_2)_6$," should read --$(SiF_2)_6$,--.

UNITED STATES PATENT AND TRADEMARK OFFICE
CERTIFICATE OF CORRECTION

PATENT NO. : 5,874,350
DATED : February 23, 1999
INVENTOR(S) : KATSUMI NAKAGAWA

Page 2 of 4

It is certified that error appears in the above-identified patent and that said Letters Patent is hereby corrected as shown below:

COLUMN 10

Line 6, "s electively" should read --selectively--; and
Line 22, "t he" should read --the--, and "withe" should read --with--.

COLUMN 11

Line 12, "will" should read --will be--; and
Line 13, "therein to" should read --thereinto--.

COLUMN 12

Line 15, "a" should read --an--;
Line 22, "((X)" should read --(X)--;
Line 47, "therein to" should read --thereinto--;
Line 58, "has" should read --have--;
Line 63, "modified" should read --modification--; and
Line 64, "tungusten" should read --tungsten--.

COLUMN 13

Line 1, "tungusten" should read --tungsten--;
Line 2, "tungusten" should read --tungsten--;
Line 4, "explasnatory" should read --explanatory--;
Line 25, "therein to" should read --thereinto--; and
Line 66, "is made such that" should be deleted and "an" should read --a--.

UNITED STATES PATENT AND TRADEMARK OFFICE
CERTIFICATE OF CORRECTION

PATENT NO. : 5,874,350

DATED : February 23, 1999

INVENTOR(S) : KATSUMI NAKAGAWA

It is certified that error appears in the above-identified patent and that said Letters Patent is hereby corrected as shown below:

COLUMN 14

Line 6, "o n" should read --on--;
Line 11, "gene ration" should read --generation--;
Line 21, "became" should read --become--;
Line 57, "became" should read --become--; and
Line 60, "became" should read --becomes--.

COLUMN 15

Line 3, "another" should read --other--;
Line 6, "t he" should read --the--;
Line 37, "an" should read --a--; and
Line 50, "deposited" should read --deposited thin--.

COLUMN 16

Line 7, "101'to" should read --101' to--;
Line 29, "t he" should read --the--;
Line 34, "1-1A)" should read --1-5A)--;
Line 39, "$\sigma d(\Omega^{-1}cm^{-1}$" should read --$\sigma d(\Omega^{-1}cm^{-1})$.--;
Line 50, "are unevennesses" should read --is uneveness--; and
Line 57, "evennesses" should read --evenness--.

COLUMN 17

Line 21, "an" should read --a--;
Line 26, "appearing" should read --appeared--;
Line 37, "104," should read --104--; and
Line 38, "timer," should read --time,--.

UNITED STATES PATENT AND TRADEMARK OFFICE
CERTIFICATE OF CORRECTION

PATENT NO. : 5,874,350

DATED : February 23, 1999

INVENTOR(S) : KATSUMI NAKAGAWA

It is certified that error appears in the above-identified patent and that said Letters Patent is hereby corrected as shown below:

<u>COLUMN 18</u>

Line 19, "tungusten" should read --tungsten--; and
    Line 21, "ASi:C:H:F" should read --A-Si:C:H:F--.

<u>COLUMN 20</u>

Table 3, "proprotion" should read --proportion--.

Signed and Sealed this

Fourth Day of April, 2000

Attest:

Q. TODD DICKINSON

Attesting Officer      Director of Patents and Trademarks